United States Patent [19]

Chen

[11] Patent Number: 4,653,173

[45] Date of Patent: Mar. 31, 1987

[54] METHOD OF MANUFACTURING AN INSULATED GATE FIELD EFFECT DEVICE

[75] Inventor: Teh-Yi J. Chen, Santa Clara, Calif.

[73] Assignee: Signetics Corporation, Sunnyvale, Calif.

[21] Appl. No.: 708,192

[22] Filed: Mar. 4, 1985

[51] Int. Cl.[4] .................. H01L 21/385; H01L 21/425
[52] U.S. Cl. .................... 29/571; 29/576 B; 148/187; 148/188
[58] Field of Search .............. 29/571, 576 B; 148/188, 148/187

[56] References Cited

U.S. PATENT DOCUMENTS

| | | |
|---|---|---|
| 3,764,413 | 10/1973 | Kakizaki et al. ............... 148/188 |
| 4,063,973 | 12/1977 | Kirita et al. .................. 148/188 |
| 4,072,545 | 2/1978 | De La Moneda ............... 148/188 |
| 4,074,304 | 2/1978 | Shiba .......................... 148/188 |
| 4,080,179 | 3/1978 | Wilting ........................ 29/571 |
| 4,204,894 | 5/1980 | Komeda et al. ................ 148/188 |
| 4,332,076 | 6/1982 | de Zaldivar ................... 29/571 |
| 4,366,613 | 1/1983 | Ogura et al. .................. 29/571 |
| 4,441,247 | 4/1984 | Gargini et al. ................. 29/571 |
| 4,477,962 | 10/1984 | Godejahn, Jr. ............... 148/188 X |
| 4,488,351 | 12/1984 | Momose ....................... 29/578 |
| 4,512,073 | 4/1985 | Hsu ............................ 29/571 |
| 4,514,251 | 4/1985 | van Ommen et al. .......... 148/182 X |
| 4,536,944 | 8/1985 | Bracco et al. ................. 29/571 |
| 4,563,805 | 1/1986 | Scovell et al. ................ 29/571 |
| 4,575,920 | 3/1986 | Tsunashima ................... 29/571 |

FOREIGN PATENT DOCUMENTS

| | | |
|---|---|---|
| 0098652 | 1/1984 | European Pat. Off. . |
| 128804 | 10/1977 | Japan . |
| 141580 | 11/1977 | Japan . |
| 23579 | 3/1978 | Japan . |
| 102071 | 6/1982 | Japan . |
| 207373 | 12/1982 | Japan . |
| 207374 | 12/1982 | Japan . |
| 207375 | 12/1982 | Japan . |
| 97869 | 6/1983 | Japan . |

OTHER PUBLICATIONS

Goto et al., *IEEE*, "A New Self-Aligned Source/Drain Diffusion Technology from Selectively Oxidized Poly-Silicon", 1979, pp. 585-588.

*Primary Examiner*—George T. Ozaki
*Attorney, Agent, or Firm*—Robert T. Mayer

[57] ABSTRACT

A method for fabricating insulated gate field effect transistors in NMOS or CMOS with source and drain regions having lightly doped extensions wherein the source and drain regions are made with a self-aligned process and a device made in accordance with such a method.

12 Claims, 5 Drawing Figures

METHOD OF MANUFACTURING AN INSULATED GATE FIELD EFFECT DEVICE

This is an invention in the semiconductor art. More particularly, it involves a method of manufacturing an insulated gate field effect device. Further, it relates to a field effect device manufactured by the method.

In field effect devices, such as, an insulated gate field effect transistor (IGFET), it is desirable that the source and drain zones in the immediate proximity of the gate electrode have a lightly doped extension. This is particularly important in field effect devices having a very small channel length. The lightly doped extension in such devices increases the breakdown voltage of the drain gate junction and prevents the injection of hot charge carriers into the gate dielectric.

It is an object of this invention to provide a method for manufacturing an insulated gate field effect transistor having lightly doped source and drain extensions and more highly doped source and drain contact areas.

One of the advantages of the invention is that it is a highly reproducible fabrication technique.

One of the features of the invention is that it uses a self-aligned process.

Another feature of the invention is that it can be used to make either NMOS or CMOS devices.

In accordance with the invention, there is provided a method of manufacturing an insulated gate field effect device in which an electrically insulating layer is formed on the surface of a semiconductor region of a first conductivity type. This insulating layer is formed at least in the area in which the gate electrode is to be formed. The method includes depositing a doped polysilicon layer on the insulating layer. A patterned masking layer is provided on the polysilicon layer leaving a mask over the area in which the gate electrode is to be formed. The method diffuses the dopant from the polysilicon layer through the insulating layer into the semiconductor region on both sides of the mask thereby forming source and drain regions of a second conductivity type with lightly doped extensions. This diffusion is accomplished by heat treating the polysilicon in an oxidizing atmosphere whereby the polysilicon layer is oxidized. Oxidation is prevented where the mask is on the polysilicon layer except for portions which are laterally oxidized under the edges of the mask. Diffusion is prevented where the oxidation has been prevented. The unoxidized area of the polysilicon forms the gate. The method etches the oxidized layer except for the laterally oxidized portions thereof. These portions are protected from etching by the mask. The insulating layer under the etched oxidizing layer is also etched away thereby exposing the source and drain regions. The method also includes the step of ion implanting a dopant into the exposed source and drain regions to produce highly doped regions of a second conductivity type.

Other objects, features and advantages of the invention will be apparent from the following description and appended clams when considered in conjunction with the accompanying drawing in which.

Figure 1:
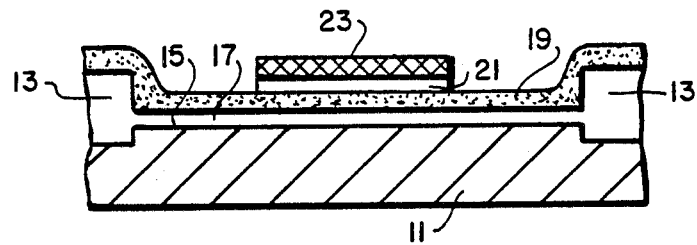
FIG. 1 is a cross-section of a device at an interim stage of its manufacture in accordance with the invention.

The drawing is purely schematic and not to scale. This is particularly so with respect to the thicknesses of the elements of the device shown. Corresponding parts are designated by the same reference numerals in the various figures. Semiconductor regions of the same conductivity type are cross-hatched in the same direction.

FIG. 1 shows a device made in accordance with the invention at an interim stage in the practice of the method of the invention. The method starts with a semiconductor body 11 which in this case is chosen to be silicon of the p-type conductivity. As will be apparent to those skilled in the art, however, the body could be of the n-type conductivity. An approximately one (1) micron thick layer 13 of silicon oxide is provided on body 11 by using any known method. An aperture is etched in layer 13 down to surface 15 of semiconductor body 11. Surface 15 is covered with an electrically insulating layer 17, also of silicon oxide, approximately 200 to 500 angstroms thick. This forms the gate oxide and is obtained, for example, by thermal oxidation. A polycrystalline silicon layer 19 between 0.15 and 0.25 microns thick is deposited on insulating layer 17 and on field oxide 13 in a typical manner such as by decomposition of a gaseous silicon compound. Polysilicon layer 19 is doped with an n-type dopant. Oxychloride phosphorus ($POCl_3$) is presently preferred for this purpose, although other type dopants may also be used. (If the method started with an n-type body obviously a p-type dopant, such as boron, would be used.)

In a manner well known in semiconductor technology, a 0.05 micron thick silicon oxide layer 21 may optionally be provided over layer 19. On top of this by means of low pressure chemical vapor deposition, a 0.08 to 0.2 micron thick silicon nitride layer 23 is provided. By way of photolithographic etching methods conventionally used in semiconductor technology, layers 21 and 23 are then given a certain pattern in which a layer of photolacquer (not shown) may be used as a mask. Phosphoric acid may be used as an etchant for the silicon nitride and a hydrofluoric acid containing solution may be used as an etchant for the silicon oxide. At that point in the method, a device such as shown in FIG. 1 is obtained.

Figure 2:
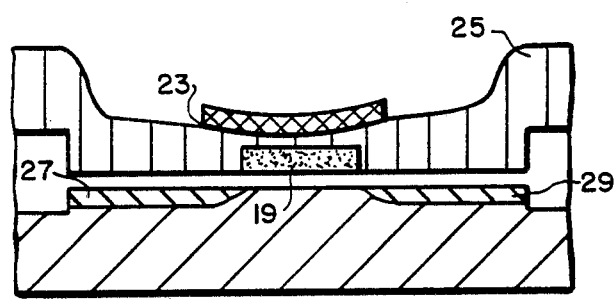
FIG. 2 is a cross-section of the device of FIG. 1 at a later stage in its manufacture.

Polysilicon layer 19 is then oxidized by heat treating in an oxidizing atmosphere. This oxidizes the polysilicon to form the oxide layer 25. It also diffuses the n-type dopant from the polysilicon layer through insulating layer 17 into semiconductor body 11 on both sides of the mask formed by nitride layer 23 to form source and drain regions 27 and 29. By properly selecting the resistivity of semiconductor body 11, the oxidation temperature and time and the polysilicon thickness and resistivity, the desired junction depth of source and drain regions 27 and 29 and the lateral oxidation and diffusion under mask 23 is appropriately controlled. For thin gate oxides, for example, a high pressure polyoxidation at low temperatures such as 900° C. can be used to prevent the formation of junctions that are too deep. This process of forming junctions through polysilicon oxidation is known and provides source and drain regions with lightly doped extensions, as shown in FIG. 2. By controlling the amount of lateral oxidation that takes place under mask 23 the size of gate electrode 19 can be predetermined.

Figure 3:
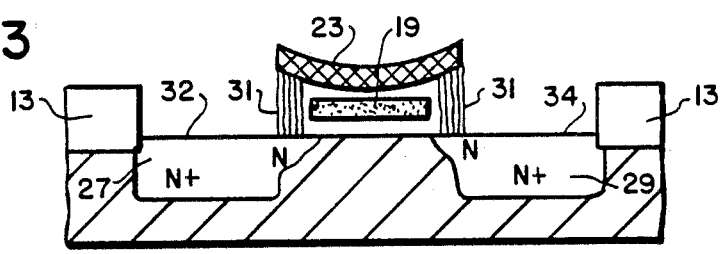
FIG. 3 is a cross-section of a device of FIGS. 1 and 2 at a still later stage of its manufacture.

After oxidation an anisotropic reactive ion etching is performed using the nitride layer 23 as a mask. During etching, the laterally oxidized sections or spacers 31 (FIG. 3) are protected from etching by mask 23. As can be seen, insulating layer 17 not protected by mask 23 is also etched away to expose the upper surfaces 32 and 34 of source and drain regions 27 and 29. Arsenic is then ion implanted into the exposed source and drain regions to produce highly doped regions of an n-plus type conductivity. As a result, source and drain regions are produced with n-type conductivity extensions under spacers 31 and n+type conductivity regions in the prescribed contact areas. (If p-type source and drain regions are formed in an n-type body, a p+type conductivity dopant such as boron, would be used in the ion implantation step.)

Figure 4:
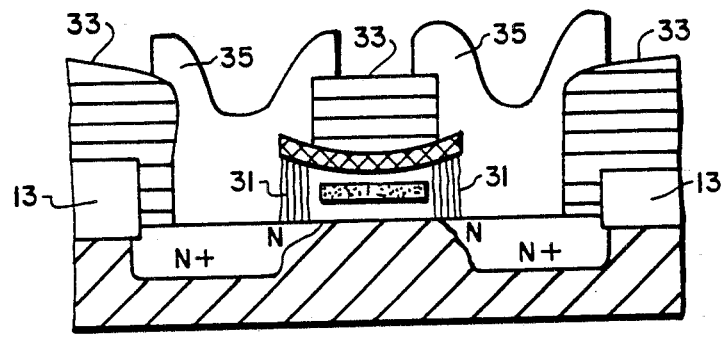
FIG. 4 is a cross-section of the device of FIG. 3 after one type of metallization.

Phosphorsilicate glass 33 is deposited on top of the entire device. Contact openings are etched in this glass by the use of oversized masks in any well known manner. Aluminum silicon 35 is then deposited in the contact openings to provide direct electrical contact to the source and drain regions. By using a photolithographic process to etch away the undesired aluminum, the device shown in FIG. 4 is produced.

Figure 5:
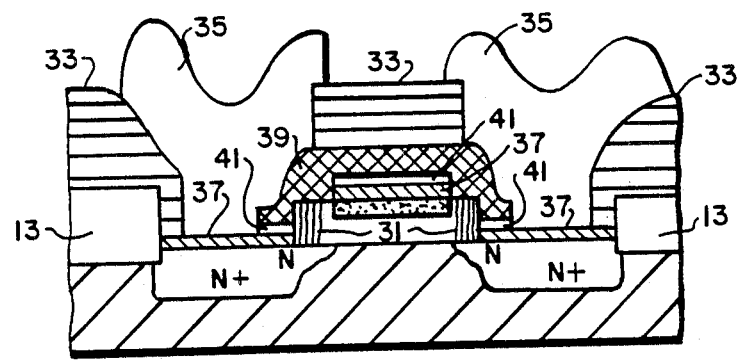
FIG. 5 is a cross-section of the device of FIG. 3 after another type of metallization.

If it is desired to add a silicide layer before metallization, a device as that shown in FIG. 5 is produced. Starting with the interim device of FIG. 3, a thin oxide is grown on the contact areas 32 and 34 of the source and drain. The silicon nitride layer 23 is then etched away. The thin oxide on the source and drain contact areas 32 and 34 and the optional pad oxide 21 (FIG. 1), if any, is also etched away. In the preferred embodiment, titanium is then deposited on the source and drain contact areas and on gate 19 to form the silicide layers 37 shown in FIG. 5. A thin oxide 41 is then deposited over the silicide. Silicon nitride 39 is then deposited on top of the thin oxide layer. With an oversized mask of photoresist, the silicon nitride and the thin oxide layer are both etched away to leave the patterned silicon nitride 39 as shown in FIG. 5 and the oxide layers 41 as shown in the same figure. After this etching, phosphosilicate glass 33 is deposited on the device and etched to expose contact areas. Aluminum silicon contacts 35 are then deposited in any well known manner.

From the foregoing, it will be apparent to those skilled in the art that both NMOS and CMOS devices can be fabricated from the disclosed self-aligned method.

It is understood that various modifications to the above-described method and device will become evident to those skilled in the art and that the arrangement described herein is for illustrative purposes and is not to be considered restrictive.

What is claimed is:

1. A method of manufacturing an insulated gate field effect device in which an electrically insulating layer is formed on the surface of a semiconductor region of a first conductivity type at least in the area in which a gate electrode is to be formed, including
    depositing a polysilicon layer doped with a second conductivity type dopont on said insulating layer;
    providing a patterned masking layer on said polysilicon layer leaving a mask over the area in which the gate electrode is to be formed;
    diffusing said dopant from said polysilicon layer through said insulating layer into said semiconductor region on both sides of said mask thereby forming source and drain regions of a second conductivity type with lightly doped extensions, said diffusion being produced by heat treating said polysilicon in an oxidizing atmosphere whereby said polysilicon layer is oxidized;
    said oxidation being prevented where said mask is on said polysilicon layer except for portions which are laterally oxidized under the edges of said mask;
    said diffusion being prevented where said oxidation has been prevented, said unoxidized area forming said gate electrode;
    etching said oxidized layer to prepare said source and drain regions for an ion implantation step; and
    ion implanting a dopant into said source and drain regions to produce highly doped regions of said second conductivity type.

2. A method according to claim 1 wherein said oxidized layer is etched except for the laterally oxidized portions thereof.

3. A method according to claim 2, wherein said mask and said laterally oxidized portions shield said lightly doped extensions during said ion implantation.

4. A method according to claim 3, wherein said insulating layer under said etched oxidizing layer is also etched prior to said ion implanting step thereby exposing said source and drain regions, said exposed source and drain regions serving as contact areas for said field effect device.

5. A method according to claim 4, including metallizing after said ion implantation by depositing metal directly on at least a portion of each contact area.

6. A method according to claim 4, including applying silicide to at least a portion of each contact area and metalizing by depositing metal on said silicide.

7. A method according to claims 5 or 6, wherein the first conductivity type is a p-type semiconductor and said doped polysilicon is doped with an n-type dopant.

8. A method according to claim 7, wherein said polysilicon n-type dopant is oxychloride phosphorus ($POCl_3$).

9. A method according to claim 8, wherein said ion implanted dopant is arsenic.

10. A method according to claims 5 or 6, wherein said first conductivity type is an n-type semiconductor and said doped polysilicon is doped with a p-type dopant.

11. A method according to claim 10, wherein said polysilicon p-type dopant is boron.

12. A method according to claim 11, wherein said ion implanted dopant is boron.

* * * * *